United States Patent
Wang et al.

(10) Patent No.: US 10,619,802 B2
(45) Date of Patent: Apr. 14, 2020

(54) SOLID STATE WHITE-LIGHT LAMP

(71) Applicants: Tiejun Wang, Lin'an (CN); Dengke Cai, Willoughby, OH (US)

(72) Inventors: Tiejun Wang, Lin'an (CN); Dengke Cai, Willoughby, OH (US)

(*) Notice: Subject to any disclaimer, the term of this patent is extended or adjusted under 35 U.S.C. 154(b) by 0 days.

(21) Appl. No.: 16/133,800

(22) Filed: Sep. 18, 2018

(65) Prior Publication Data

US 2020/0088359 A1   Mar. 19, 2020

(51) Int. Cl.
| | |
|---|---|
| *F21K 9/64* | (2016.01) |
| *F21K 9/232* | (2016.01) |
| *H01L 33/56* | (2010.01) |
| *H01L 33/50* | (2010.01) |
| *F21V 9/08* | (2018.01) |
| *F21Y 115/10* | (2016.01) |

(52) U.S. Cl.
CPC ............... *F21K 9/64* (2016.08); *F21K 9/232* (2016.08); *F21V 9/08* (2013.01); *H01L 33/504* (2013.01); *H01L 33/56* (2013.01); *F21Y 2115/10* (2016.08)

(58) Field of Classification Search
CPC ... F21K 9/64; F21K 9/232; F21K 9/08; H01L 25/075–0756; H01L 33/50–508
See application file for complete search history.

(56) References Cited

U.S. PATENT DOCUMENTS

| 8,740,413 B1* | 6/2014 | Krames ............... H01L 25/0753 |
| | | 257/98 |
| 9,243,777 B2 | 1/2016 | Donofrio et al. |
| 9,657,922 B2 | 5/2017 | Negley et al. |
| 10,147,850 B1* | 12/2018 | Krames ..................... F21K 9/64 |
| 2011/0025183 A1* | 2/2011 | Su ....................... H01L 25/0753 |
| | | 313/1 |

(Continued)

FOREIGN PATENT DOCUMENTS

| AU | 2017251855 A1 | 11/2017 |
| CN | 106398157 A1 | 2/2017 |
| WO | 2016057604 A1 | 4/2016 |

OTHER PUBLICATIONS

Anant A. Setlur, Phosphors for LED-based Solid-State Lighting, The Electrochemical Society Interface, Winter 2009.

*Primary Examiner* — Mariceli Santiago
(74) *Attorney, Agent, or Firm* — Daniel M. Cohn; Howard M. Cohn

(57) ABSTRACT

A lamp includes blue-pumped solid state light emitters (SSLEs) and violet-pumped SSLEs. Each blue-pumped SSLE has a blue excitation source configured to output blue light, and blue-pumped phosphors for converting a portion of the blue light to non-blue visible light, for the blue-pumped SSLEs to output blue-pumped white light. Each violet-pumped SSLE has a violet excitation source configured to output violet light, and violet-pumped phosphors for converting a portion of the violet light to non-violet visible light, for the one or more violet-pumped SSLEs to output violet-pumped white light. A support structure fixedly supports the blue-pumped SSLEs and the violet-pumped SSLEs in an orientation such that the blue-pumped white light and the violet-pumped white light will propagate in a common direction and intermix with each other through beam-spreading to yield a combined white light.

20 Claims, 7 Drawing Sheets

(56) References Cited

U.S. PATENT DOCUMENTS

| | | |
|---|---|---|
| 2014/0225137 A1* | 8/2014 | Krames .............. H01L 25/0753 |
| | | 257/89 |
| 2015/0233536 A1* | 8/2015 | Krames .................... F21K 9/56 |
| | | 362/84 |
| 2016/0018065 A1* | 1/2016 | Schinagl ............ H01L 25/0753 |
| | | 362/608 |
| 2016/0097497 A1 | 4/2016 | Benner et al. |
| 2016/0223159 A1* | 8/2016 | Katoh .................... H01L 33/60 |
| 2016/0290573 A1* | 10/2016 | Allen ..................... F21K 9/233 |
| 2017/0261181 A1 | 9/2017 | Cai et al. |
| 2017/0263592 A1* | 9/2017 | Schmidt ................... F21K 9/64 |
| 2018/0156420 A1 | 6/2018 | Dudik et al. |

* cited by examiner

SOLID STATE WHITE-LIGHT LAMP

FIELD OF THE INVENTION

This generally relates to lamps that are based on solid state light emitters (SSLEs) for emitting white light, such as lamps based on white-light LEDs.

BACKGROUND

A lamp is used to illuminate objects. Color rendering index (CRI) is a measure of the lamp's color in achieving color fidelity of the illuminated object's colors. Objects to be illuminated by a lamp may be coated with brighteners (also known as optical brightening agents and fluorescent brightening agents). Brighteners may be fluorescent chemicals that are applied to items, such as clothing and paper. The brighteners may absorb light in the ultraviolet and violet spectral regions, and emit light in the blue spectral region. The brighteners thereby brighten and color-enhance the items that the brighteners are applied to.

SUMMARY

An example lamp includes blue-pumped solid state light emitters (SSLEs) and violet-pumped SSLEs. Each blue-pumped SSLE has a blue excitation source configured to output blue light, and blue-pumped phosphors for converting a portion of the blue light to non-blue visible light, for the blue-pumped SSLEs to output blue-pumped white light. Each violet-pumped SSLE has a violet excitation source configured to output violet light, and violet-pumped phosphors for converting a portion of the violet light to non-violet visible light, for the one or more violet-pumped SSLEs to output violet-pumped white light. A support structure fixedly supports the blue-pumped SSLEs and the violet-pumped SSLEs in an orientation such that the blue-pumped white light and the violet-pumped white light will propagate in a common direction and intermix with each other through beam-spreading to yield a combined white light.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
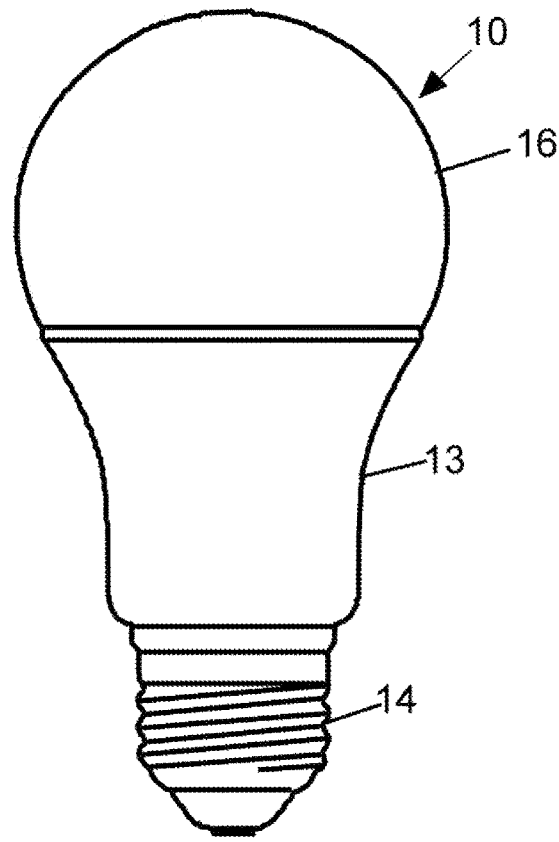

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1 is a side view of an example lamp.

Figure 2:
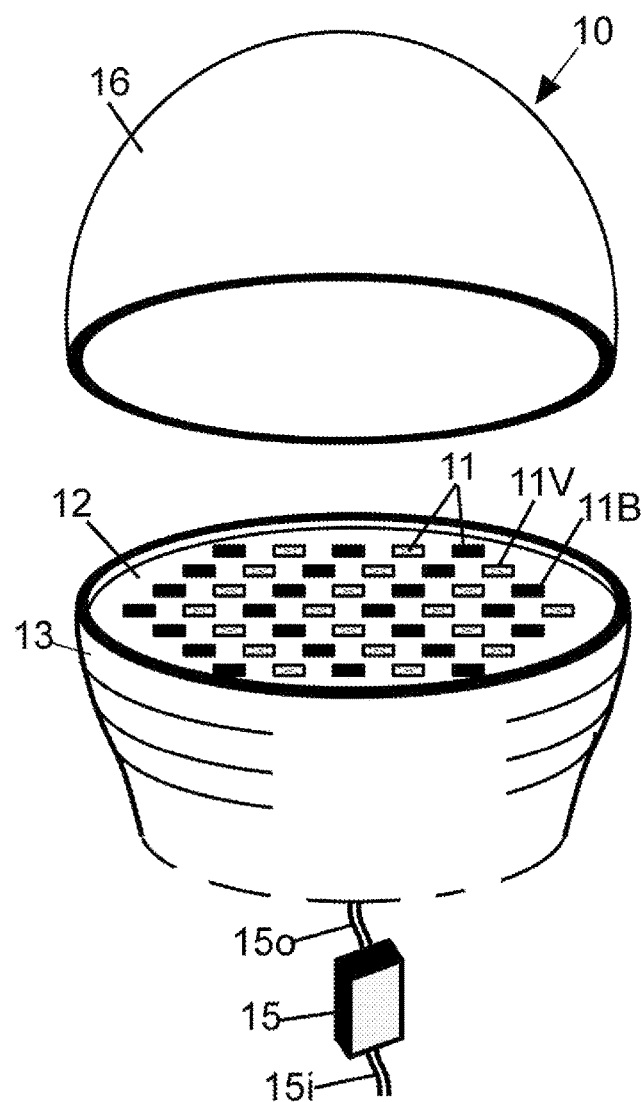

FIG. 2 is an exploded view of an upper portion of the lamp, to expose a driver and a circuit board and LEDs that are mounted on the circuit board. An arcuate broken line indicates a lower boundary of an upper portion of a housing of the lamp, for the lamp to appear as though a lower portion of the lamp's housing has been broken off at the arcuate broken line.

Figure 3:
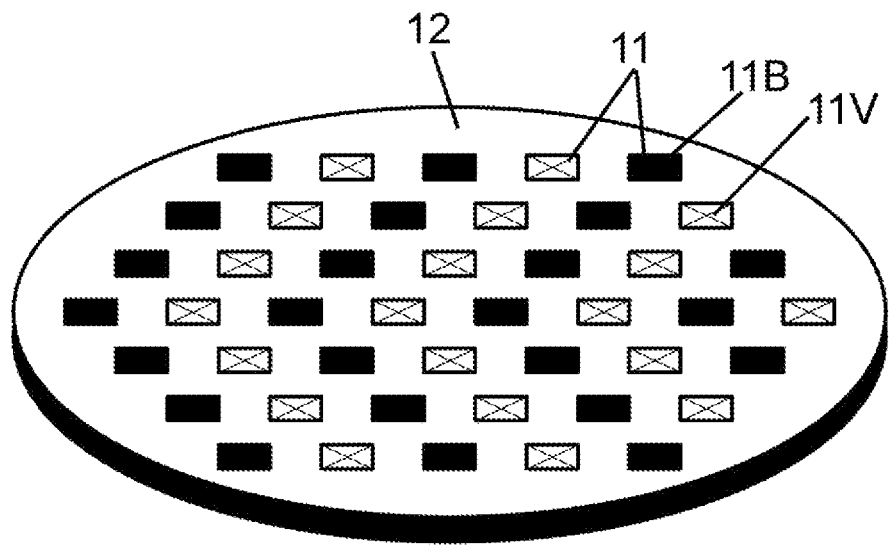

FIG. 3 is a perspective view of the circuit board and LEDs shown in FIG. 2, where the LEDs include blue-pumped white-light LEDs and violet-pumped white-light LEDs.

Figure 4:
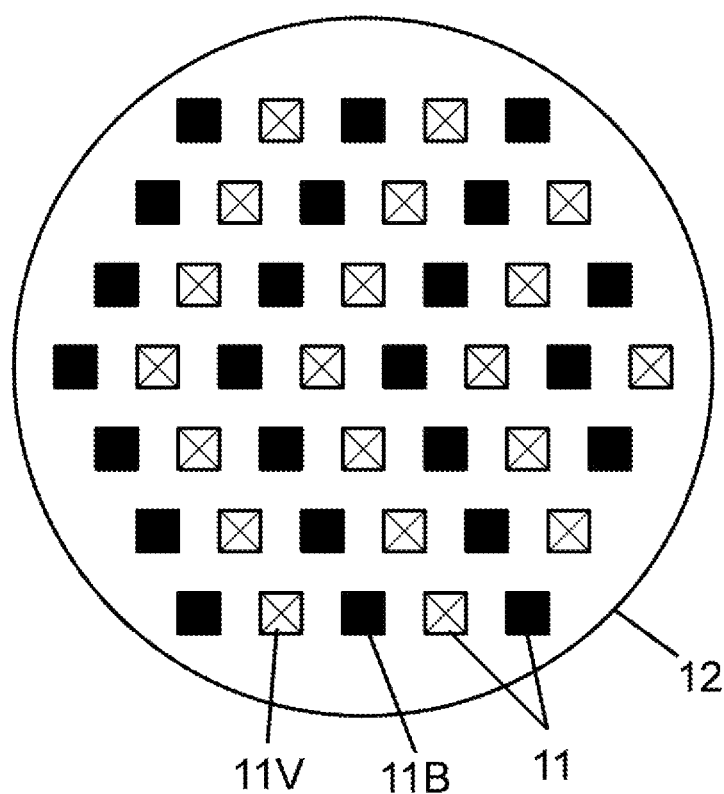

FIG. 4 is a top view of the circuit board of FIG. 3, illustrating one example arrangement of the LEDs.

Figure 5:
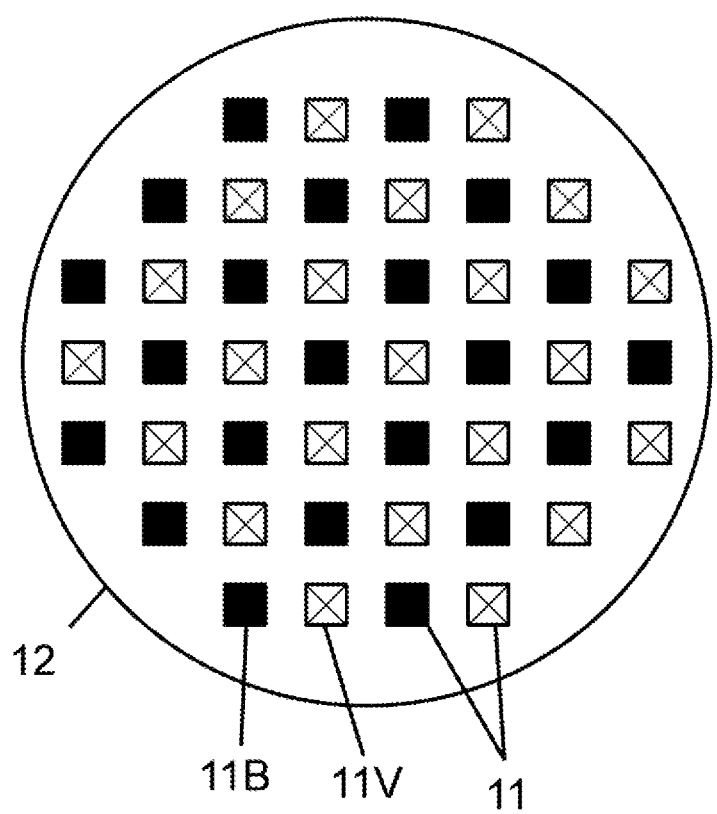

FIG. 5 is a top view of the circuit board of FIG. 4, illustrating a second example arrangement of the LEDs.

Figure 6:
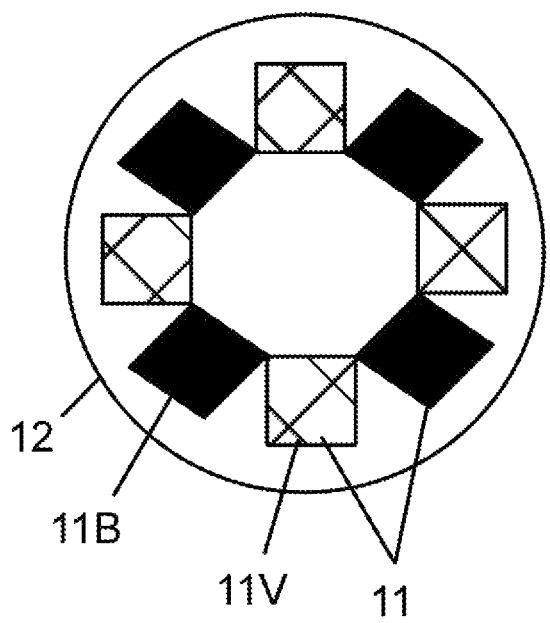

FIG. 6 is a top view of the circuit board of FIG. 4, illustrating a third example arrangement of the LEDs.

Figure 7:
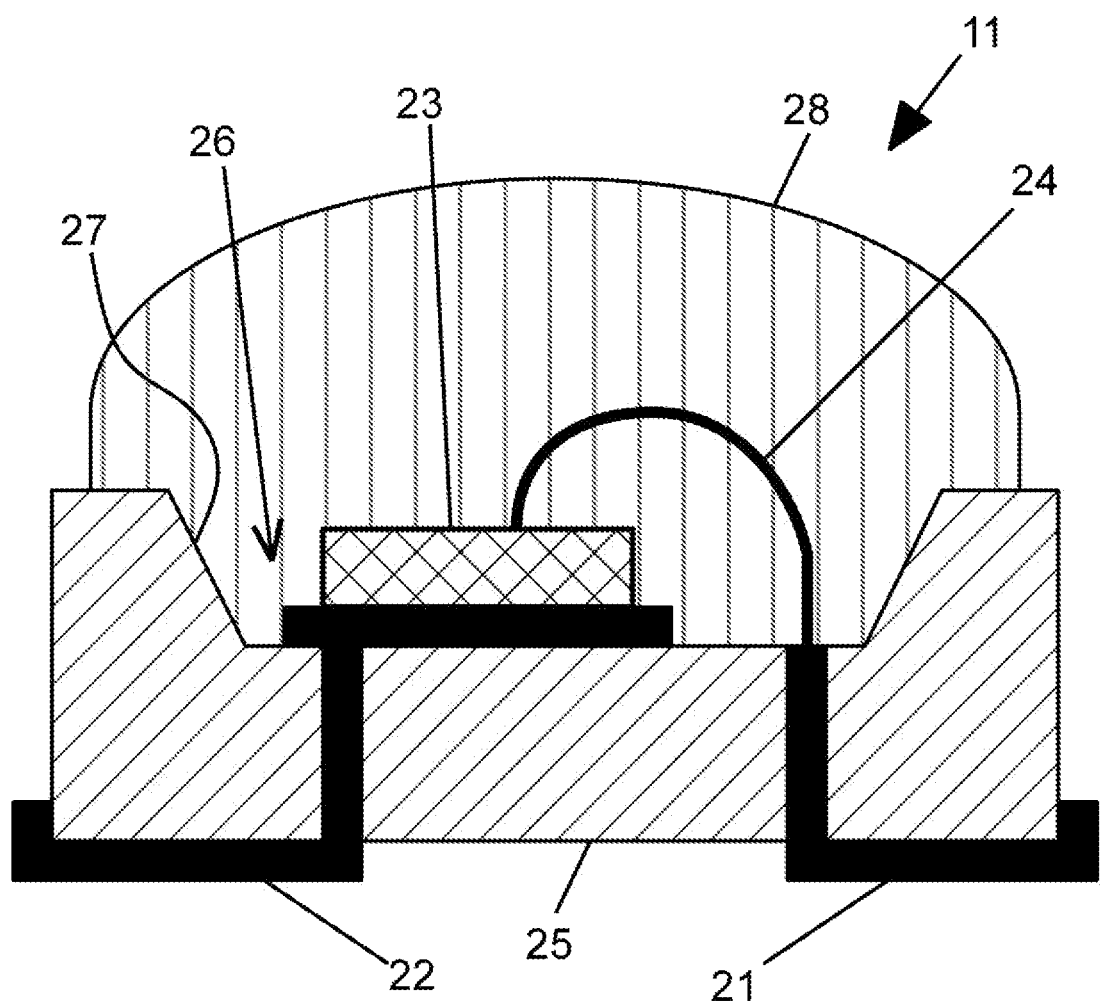

FIG. 7 is a sectional view of an example construction of an LED of FIG. 1.

Figure 8:
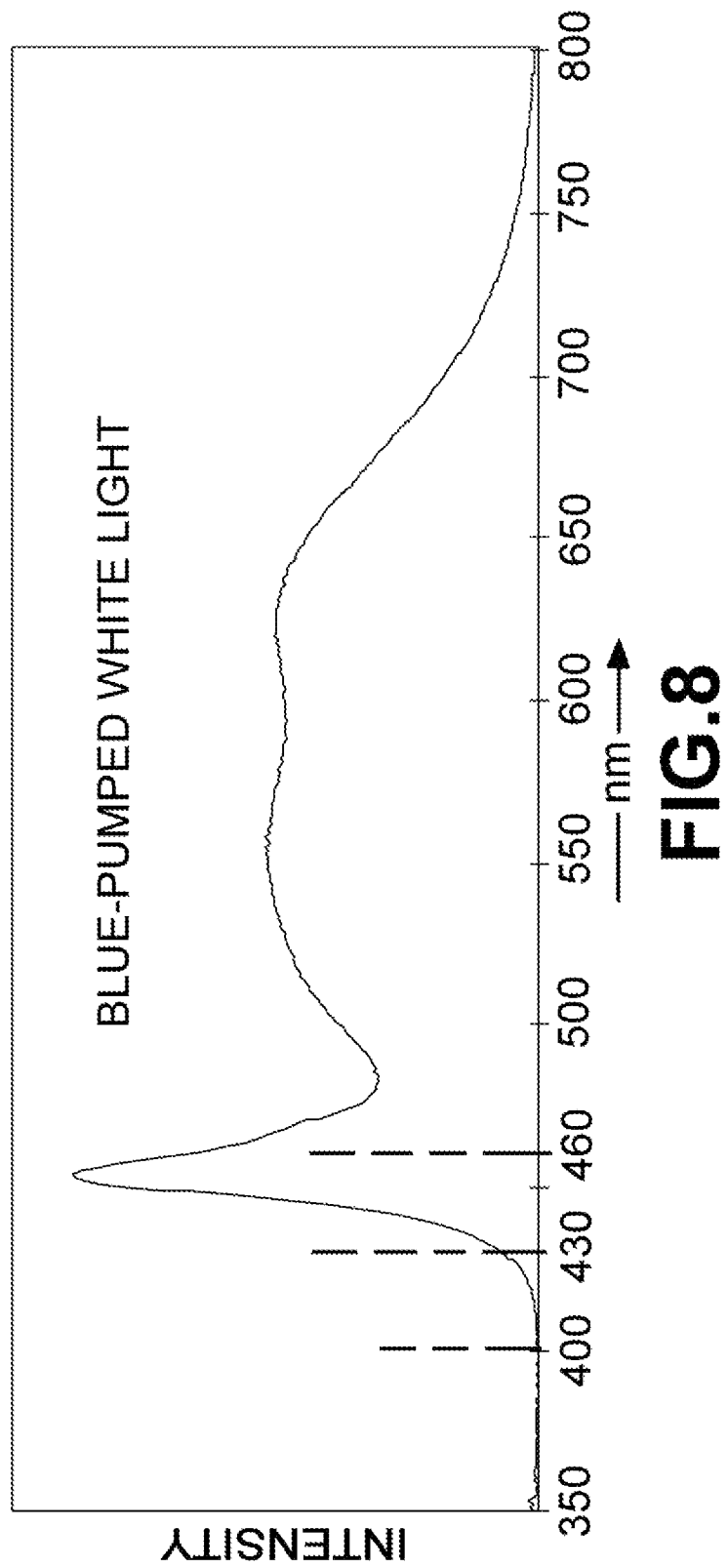

FIG. 8 is an example emission spectrum (intensity vs nm, such as joules vs nm) of blue-pumped white light emitted by the blue-pumped white-light LEDs.

Figure 9:
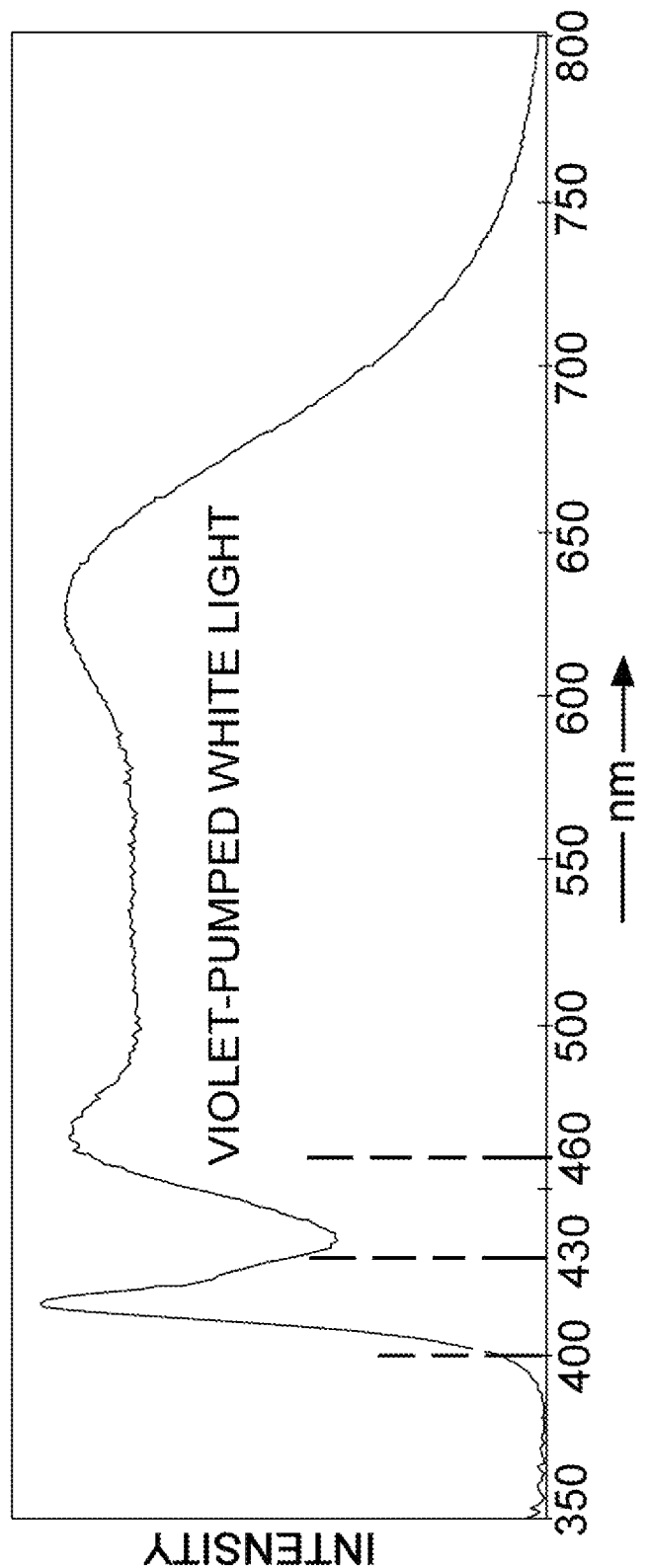

FIG. 9 is an example emission spectrum of violet-pumped white light emitted by the violet-pumped white-light LEDs.

Figure 10:
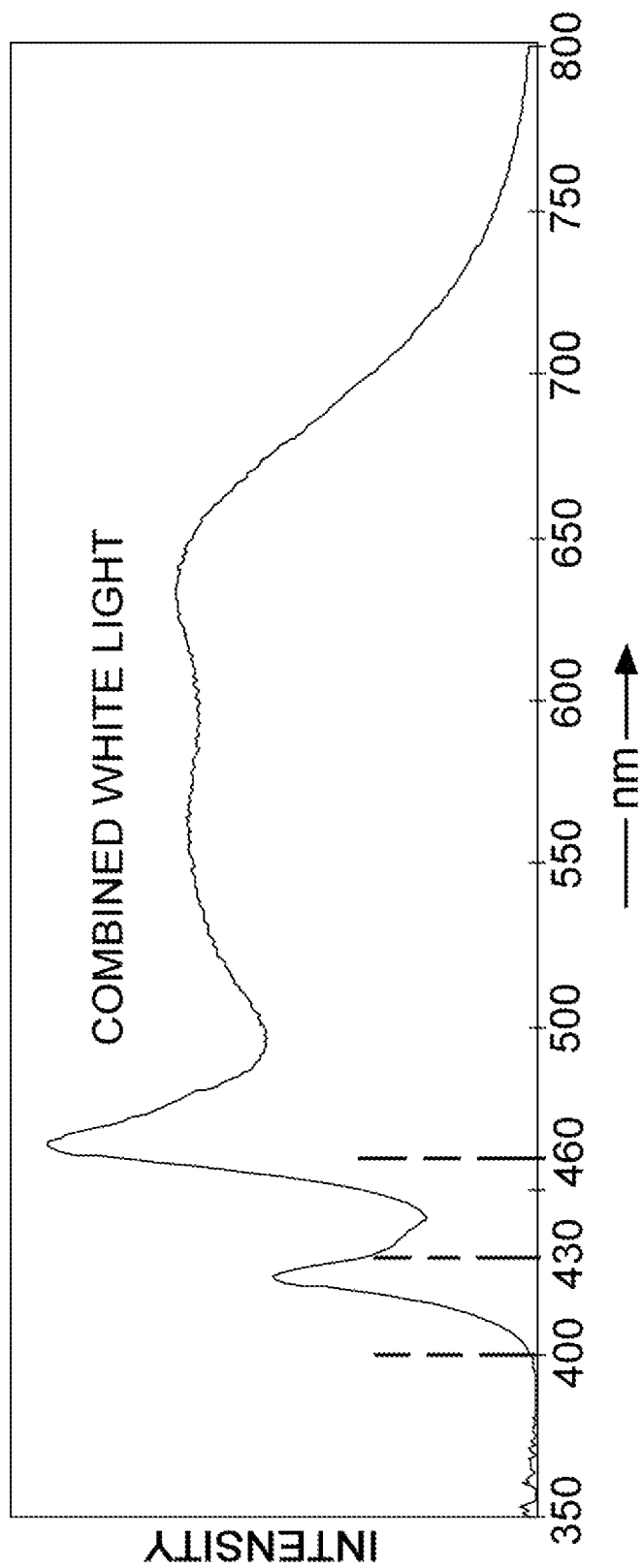

FIG. 10 is an example emission spectrum of light comprising a combination of the blue-pumped white light and the violet-pumped white-light.

DETAILED DESCRIPTION

FIGS. 1-3 show an example white light lamp 10 (light source). The lamp 10 includes an array of white-light solid state light emitters 11 (SSLEs). The SSLEs 11 in this example include blue-pumped SSLEs 11B that emit blue-pumped white light, interspersed between violet-pumped SSLEs 11V that emit violet-pumped white light. The SSLEs 11 are fixedly mounted on a circuit board 12. The circuit board 12 is mounted in a lamp housing 13. The housing 13 includes an Edison-screw base 14 configured to be screwed into a common lamp socket. A driver 15 is located within the lamp housing 13. The driver 15 inputs (through conductive wires 15i), from the screw base 14, a driver-input voltage (e.g., wall voltage, which is typically 120 VAC in the U.S.). The driver 15 generates and outputs a driver-output voltage (through conductive wires 15o) that powers the SSLEs 11. Light emitted by the blue-pumped SSLEs 11B merges with light emitted by the violet-pumped SSLEs 11V to yield a combined white light. The combined white light exits the lamp 10 through a light-transmissive (i.e., transparent or translucent) cover 16 (lens). The light-transmissive cover 15 and the circuit board 12 are both fixedly attached to the housing 13.

As shown in FIG. 2, the circuit board 12 serves as a support structure that fixedly supports the blue-pumped SSLEs 11B and the violet-pumped SSLEs 11V in the same orientation. Light beams of the blue-pumped white light and of the violet-pumped white light can propagate in a common direction, which in this example is perpendicular to the plane of the circuit board 12. The light beams (from the two sources of white light) nevertheless intermix through beam-spreading (i.e., increased-broadening with increased-distance from the SSLE) to yield a combined white light.

In this example, the SSLEs 11 are white-light light emitting diodes (LEDs). Accordingly, the SSLE's 11 include blue-pumped LEDs 11B and violet-pumped LEDs 11V.

FIG. 4 shows how the LEDs 11 in this example are arranged in rows on the circuit board 12. The rows are horizontal with respect to the circuit board's orientation in FIG. 4. The rows are staggered (misaligned relative to each other) in that each LED 11 (except at the edges) is aligned between two LEDs (11B, 11V) in the row above and between two LEDs (11B, 11V) in the row below. In each row, the blue-pumped LEDs 11B are alternatingly interspersed between the violet-pumped LEDs 11V, to yield an alternating sequence 11B, 11V, 11B, 11V, etc. Accordingly, each blue-pumped LED 11B (except at the edges) is located between two violet-pumped LEDs 11V, and each violet-pumped LED 11V is located between two blue-pumped LEDs 11B.

FIG. 5 shows another example LED-arrangement, in which the rows are not staggered (as in the example of FIG. 4), but are instead aligned with each other. The LEDs in the example of FIG. 5 are therefore arranged in both rows and columns, in which the columns are perpendicular to the rows. In the circuit board's orientation in FIG. 5, the rows appear horizontal and the columns appear vertical. In each row, the blue-pumped LEDs 11B are alternatingly interspersed between the violet-pumped LEDs 11V. Similarly in each column, the blue-pumped LEDs 11B are alternatingly interspersed between the violet-pumped LEDs 11V.

FIG. 6 shows yet another example LED-arrangement, in which the LEDs are arranged in a ring. In the ring-arrangement of FIG. 6, the blue-pumped LEDs 11B are alternatingly interspersed between the violet-pumped LEDs 11V.

FIG. 7 shows an example construction of an LED 11, which can be suitable for both types of white-light LEDs 11B, 11V. The respective LED 11 includes an anode 21 and a cathode 22. An LED die 23 is mounted on the cathode 22. In each blue-pumped LED 11B, the die 23 is a source of blue light. In each violet-pumped LED 11V, the die 23 is a source of violet light. A filament 24 (bond wire) extends from a top of the anode 21 to a top of the die 23. A substrate 25 of insulating material supports and secures the anode 21 and the cathode 22 in place. The substrate 25 includes a cavity 26 in which the die 23 is located. The cavity 26 is bounded by a reflective surface 27 (white reflective frame) of the substrate 24.

The die 23 is formed of a semiconducting material that is doped with impurities to create a p-n junction. The die 23, in both the blue-pumped LED and the violet-pumped LED, might be formed of InGaN.

The die 23 and the filament 24, for both the blue-pumped and violet-pumped LEDs, are encapsulated by (in) a rigid light-transmissive (i.e., transparent or translucent) encapsulating package 28. The encapsulating package 28 is formed of a rigid light-transmissive bulk encapsulating material. Examples of the bulk material are silicone, epoxy, acrylic, and their hybrids, etc.

The encapsulating package 28, for the blue-pumped and violet-pumped LEDs respectively, might include one or more phosphors that convert a portion of the respective blue or violet light to respective non-blue visible light and non-violet visible light. In this example, a yellow-emitting phosphor (herein called yellow phosphor) and a red-emitting phosphor (herein called red phosphor) are mixed with (blended into) the bulk encapsulating material. The phosphors in the violet-pumped LED might be chemically different than the phosphors in the blue-pumped LED. For example, the phosphors in the blue-pumped LED might be selected based on being optimal (most-effective, most-efficient) for being excited (pumped) by blue light, whereas the phosphors in the violet-pumped LED might be selected based on being optimal for being excited by violet light. A consequence (besides optimizing performance) of using phosphors in the blue-pumped LED 11B that are different than the phosphors in the violet-pumped LED 11V is that the resulting output spectrum in the green-through-red range can be different for the blue-pumped LED than the violet-pumped LED.

The phosphors, for both types of LEDs 11B, 11V in this example, are mixed with (blended into) the bulk encapsulating material. Each of the phosphors might be present in the encapsulating material in the range 0.5% to 5% by volume of the encapsulating package 25, based on different parameters, such as for example color temperature and packaging form factors.

An example of the yellow phosphor, in either type of LED 11B, 11V, is cerium-doped yttrium aluminum garnet, Ce:YAG. The Ce:YAG might include Lu. Another yellow phosphor is $Tb_{3-x}RE_xO_{12}.Ce(TAG)$ were RE is Y, Gd, La or Lu. Another yellow phosphor is $Sr_{2-x}Ba_xCa_ySiO_4$:Eu. Yet another is $LuAG;Lu_3Al_5O_{12}:Ce^{3+}$. Yet another yellow phosphor is $CaGa_2S_4:Eu^{2+}$.

An example of the red phosphor, in either type of LED 11B, 11V, is Eu-doped calcium aluminum silicon nitride, $CaAlSiN_3$:Eu. Another red phosphor is $Ca^{2+}\alpha$-SiAlON and $M_2Si_5N_8$ where M is $Ca^{2+}$, $Sr^{2+}$ or $Ba^{2+}$. Another red phosphor is $MSi_2O_2N_2:Eu^{2+}$ where M is $Ca^{2+}$, $Sr^{2+}$, or $Ba^{2+}$. Another red phosphor is $Sr_xCa_{1-x}S$:EuY were Y is halide. Another is $CaAlSiN_3$:Eu. Yet another red phosphor is $Sr_{2-y}CaySiO_4$:Eu.

The phosphors might exist in the encapsulating material in the form of particles, which might have sizes (largest dimensions) in the range 1 um to 100 um, and which are dispersed throughout the bulk encapsulating material.

A filter material might be blended (mixed) into the encapsulating materials of the encapsulating package 28 of only the blue-pumped LEDs, or of only the violet-pumped LED, or of both the blue-pumped and violet-pumped LEDs. In this example, the filter material is neodymium in a third oxidation state, abbreviated $Nd^{3+}$ and Nd(III). The Nd might be bonded to a halide (abbreviated X in formulas), which might be a non-fluoride halide, for example Cl. An example of the Nd halide is $NdX_3$, such as $NdCl_3$. The Nd might also be bonded to an oxide (O) group. For example $NdCl_xO_y$, in which x and y are positive real numbers. $NdCl_xO_y$ is NdClO in an example where x=y=1. The Nd molecule might be hydrated. Examples are $NdCl_xO_y.zH_2O$ (where z is a positive real number), such as $NdCl_3.H_2O$. The filter material might be present in the form of particles of size (greatest dimension) in the range 0.5 um to 100 um, for example size D50. $NdCl_3$ filter material might have a notch-filtering absorption peak in the range 560-600 nm, and more particularly in the range 580-600 nm.

In operation, in the case of the blue-pumped white-light LEDs, electrical current, flowing from the anode 21 through the filament 24 and die 23 to the cathode 22, activates the die 23 to emit a spectral band that includes blue light. The blue-emitting die 23 (and the blue light it produces) is an excitation source for the phosphors, which convert a portion of the blue light to non-blue visible light. The yellow phosphor is excited by the blue light to convert a portion of the blue light (blue excitation light) to a spectral band in the yellow region (which can include yellow/green). The red phosphor is excited by the blue light to convert a portion of the blue light to a spectral band in the red region. The filter material in the encapsulating package 28 serves as a notch filter, by absorbing a narrow band of light within the yellow spectral region. The resulting three bands (blue, yellow, red) exit the encapsulating package 28 as blue-pumped white light. This white light has enhanced color quality, e.g., enhanced color rendering index (CRI), due to the notch filter.

Similarly in the case of the violet-pumped white-light LEDs, the electrical current activates the die 13 to emit a spectral band that includes violet light. The violet-emitting die (and the violet light it produces) is an excitation source for the phosphors, which convert a portion of the violet light to non-violet visible light. The yellow phosphor excited by the violet light, converts a portion of the violet light (excitation light) to a spectral band in the yellow region (which can include yellow/green). The red phosphor, excited by the violet light, converts a portion of the violet light to a spectral band in the red region. The filter material in the encapsulating package 28 serves as a notch filter, by absorbing a narrow band of light within the yellow spectral region. The resulting three bands (violet, yellow, red) exit the encapsulating package 28 as violet-pumped white light, with enhanced color quality (e.g., enhanced CRI) due to the notch filter.

Both the blue-pumped white light and the violet-pumped white light might have approximately (substantially) the same correlation color temperature (CCT), for example 5000K. However, the two white lights (i.e., blue-pumped and violet-pumped) might nevertheless appear visually (i.e., to human observers) as being different in color (color blend) from each other. Similarly, an item, and especially an item with a fluorescent coating, might appear visually as being of a color (color blend) that is different when illuminated by the blue-pumped white light than when illuminated by the violet-pumped white light.

Since the particles (of the phosphors and filter material) have refractive indexes (RIs) that differ from the RI of the bulk encapsulating material, light propagating through the encapsulating package is reflected (such as by mie scattering) by each particle it passes through. The percentage of light reflected from a given particle is a positive function of the difference in RI between the particles and the bulk material. The number of reflections a ray of light undergoes before exiting the packages is a positive function of the concentration (number per volume) of the particles within the bulk material and the difference in RI between the particles and the bulk material. The occurrence of multiple reflections (light scattering) causes the light ray to take a path through the encapsulating package 28 that is both contorted and longer than if the reflections did not occur. The greater the extent of light scattering, and thus the longer the light path within the package, the greater the number of times the light will impinge the particles (of phosphors and filter material) before exiting the package, and thus the greater the amount of phosphorescence and absorption the particles (of phosphors and filter material) will yield. The light scattering described above might cause the package to appear translucent as opposed to transparent. Also, since the bulk material is not 100% transparent (i.e., it is slightly absorptive) and the package frame is not 100% reflective, the greater the RI difference, and thus the longer the light path within the package, the greater the light absorption by the package, and thus the lower the output efficiency (lumens per watt, or radiation output wattage per electrical input wattage) for that package.

Based on mie scattering theory, a larger RI difference between the particles (filter and phosphors) and the bulk encapsulation material helps improve particle scattering efficiency or material utilization efficiency within the encapsulating package 28 and thus decreases the amount of filter material needed in the package 28, and therefore reduces material cost. Particle size is another factor affecting scattering efficiency. Smaller particle size helps lower the probability of non-absorbed photons (for those photons which are not absorbed by the filter material, but refracted) trapped inside the encapsulating package 28 and results in greater absorption from LED package materials such as white reflective frame 27.

As explained above, the filter material serves as a notch filter by absorbing in narrow spectral region to improve CRI. The filter material also exhibits a less-significant absorption at other locations in the spectrum, which reduces energy efficiency in terms of lumens-per-watt (LPW), without significantly affecting CRI. Accordingly, for a given selection of package components (bulk encapsulating material, yellow phosphor, red phosphor, and filter materiel) and for a given concentration of each of the phosphors within the bulk material, CRI is a positive function of (positively related to) the filter material's concentration and LPW is an inverse function of (inversely related to) the filter material's concentration.

Accordingly, for either blue-pumped or violet-pumped LEDs 11B, 11V, CRI increases and LPW decreases with increasing concentration of the filter material. An increase of CRI is at the expense of LPW, and vice versa. The filter material might be present at a concentration in the range 0.5% to 3% by volume of the encapsulating package 28. This concentration range might provide an optimum balance of CRI and LPW. A concentration below this range might provide insufficient CRI for best color rendering. A concentration above this range might provide insufficient LPW for best efficiency.

FIG. 8 shows an example emission spectrum of the blue-pumped white-light LED 11B. It has a blue peak in the range 430 nm-460 nm. It also has a band emitted by the yellow phosphor (which might be roughly in the range 460 nm-600 nm) and a band emitted by the red phosphor (which might be roughly in the range 600-800 nm). In this example blue-pumped white-light spectrum, the total radiation wattage in the (nominally-ultraviolet) range 300 nm-400 nm is less than 1% of total radiation wattage in the (nominally-visible) range 400 nm-800 nm.

FIG. 9 shows an example emission spectrum of the violet-pumped white-light LED 11V. It has a violet peak in the range 400 nm to 430 nm, a band emitted by the yellow phosphor, and a band emitted by the red phosphor. Part of the band emitted by the yellow phosphor of the violet-pumped LED is in the blue region and overlaps the blue excitation band emitted by the blue-pumped LED die. In this example violet-pumped white-light spectrum, the total radiation wattage in the (nominally-ultraviolet) range 300 nm-400 nm is less than 1% of total radiation wattage in the (nominally-visible) range 400 nm-800 nm.

In this example, the violet-pumped white light provides better color rendering (e.g., higher CRI) than the blue-pumped white light. However, the blue-pumped white light LED might have better efficiency, e.g., in terms of radiant output wattage per electrical input wattage, or in terms of radiant output lumens per electrical input wattage.

FIG. 10 shows an example emission spectrum of the combined white light, formed by intermixing (merging) of the blue-pumped white light with the violet-pumped white light.

The combined white light has total radiation wattage in the (ultraviolet) range 300 nm-400 nm that is less than 1% of total radiation wattage in the (visible) range 400 nm-800 nm. This relatively low ultraviolet content of the combined light is due to low ultraviolet content of both the blue-pumped white light and the violet-pumped white light. This relatively low ultraviolet content of the combined light improves the suitability of forming the protective light-transmissive cover 16 (FIGS. 1-2) from materials that degrade (e.g., discolor) from ultraviolet light. One such material is polycarbonate, which is preferable to other lens materials in terms of durability and cost, but is degraded by ultraviolet light. The relatively low ultraviolet content of the combined light also improves this light's suitability for illuminating objects that might degrade from ultraviolet light, such as photographs, paintings, archeological and ancient objects, and museum pieces.

The combined white light's band in the violet region is of sufficiently-short wavelength for exciting brighteners (optical brightening agents) that are applied to objects, such as cloth and paper.

The blue-pumped white light, the violet-pumped white light, and the combined white light might each have a CRI of same as or greater than 70.

The blue-pumped white light might have a CCT in the range 2200K-6500K. The violet-pumped white light might have a CCT in the range 3500K-7000K. The combined white light might have a CCT in the range 2500K-6500K.

The blue-pumped white light might have a spectrum in which total radiation wattage in the range 430 nm-460 nm is less than 8% of total radiation wattage in the 400 nm-800 nm. The violet-pumped white light might have a spectrum in which total radiation wattage in the range 400 nm-430 nm is at least 1% of total radiation wattage in the range 400 nm-800 nm.

Mixing between the two types of white light (blue-pumped and violet-pumped) is facilitated by any one or more of the following features that are exemplified in LED-arrangements of FIGS. 4-6: The blue-pumped LEDs 11B are alternatingly interspersed between the violet-pumped LEDs 11V, either in each row (FIG. 4), or in each row and each column (FIG. 5), or in a circular path (FIG. 6).

To optimize mixing between the blue-pumped light and the violet-pumped light, the blue-pumped LEDs 11B might be positioned close to the violet-pumped LEDs 11V. This is facilitated by the blue-pumped LEDs being alternatingly interspersed between the violet-pumped LEDs. This alternating interspersion of LEDs is facilitated by the number (M) of blue-pumped LEDs (of the lamp) approximately equaling the number (N) of violet-pumped LEDs (of the lamp). For example, M might be equal to 90%-110% of N, which includes the possibility of M equaling N. In a similar manner, the number (Mrow) of blue-pumped LEDs in a respective row might be within the range 90%-110% of the number (Nrow) of violet-pumped LEDs in that respective row, including the possibility of Mrow equaling Nrow.

The components and procedures described above provide examples of elements recited in the claims. They also provide examples of how a person of ordinary skill in the art can make and use the claimed invention. They are described here to provide enablement and best mode without imposing limitations that are not recited in the claims. In some instances in the above description, a term is followed by a substantially equivalent term or alternative term enclosed in parentheses.

The invention claimed is:

1. A lamp comprising:
   one or more blue-pumped solid state light emitters (SSLEs), each having
      a blue excitation source configured to output blue light, and
      one or more blue-pumped phosphors for converting a portion of the blue light to non-blue visible light, for the one or more blue-pumped SSLEs to output blue-pumped white light;
   one or more violet-pumped SSLEs, each having
      a violet excitation source configured to output violet light, and
      one or more violet-pumped phosphors for converting a portion of the violet light to non-violet visible light, for the one or more violet-pumped SSLEs to output violet-pumped white light; and
   a support structure configured to fixedly support the one or more blue-pumped SSLEs and the one or more violet-pumped SSLEs in an orientation such that the blue-pumped white light and the violet-pumped white light will propagate in a common direction and intermix with each other through beam-spreading to yield a combined white light;
   wherein the blue-pumped white-light SSLE has higher color rendering index (CRI) but lower output-radiation-watts per input-electrical-watts than the violet-pumped white-light SSLE.

2. The lamp of claim 1, wherein:
   the one or more blue-pumped SSLEs comprise one or more blue-pumped light emitting diodes (LEDs); and
   the one or more violet-pumped SSLEs comprise one or more violet-pumped LEDs.

3. The lamp of claim 1, wherein the blue light, that is output by the blue excitation source, has a peak in the spectral range 430 nm to 460 nm.

4. The lamp of claim 1, wherein the violet light, that is output by the violet excitation source, has a peak in the spectral range 400 nm to 430 nm.

5. The lamp of claim 1, wherein the combined white light has total radiation wattage in the range 300 nm-400 nm that is less than 1% of total radiation wattage in the range 400 nm-800 nm.

6. The lamp of claim 1, wherein:
   the blue-pumped white light has a spectrum in which total radiation wattage in the range 430 nm-460 nm is less than 8% of total radiation wattage in the 400 nm-800 nm,
   the violet-pumped white light has a spectrum in which total radiation wattage in the range 400 nm-430 nm is at least 1% of total radiation wattage in the range 400 nm-800 nm.

7. The lamp of claim 1, wherein:
   the blue-pumped white light has a color rendering index (CRI) of at least 70;
   the violet-pumped white light has a CRI of at least 70; and
   the combined white light has a CRI of greater than 70.

8. The lamp of claim 1, wherein:
   the blue-pumped white light has a correlated color temperature (CCT) in the range 2200K-6500K;
   the violet-pumped white light has a CCT in the range 3500K-7000K; and
   the combined white light has a CCT in the range 2500K-6500K.

9. The lamp of claim 1, wherein the one or more blue-pumped phosphors include:
   a blue-excited yellow phosphor configured to emit yellow light; and
   a blue-excited red phosphor configured to emit red light.

10. The lamp of claim 9, wherein the one or more violet-pumped phosphors include:
    a violet-excited yellow phosphor configured to emit yellow light, and
    a violet-excited red phosphor configured to emit red light.

11. The lamp of claim 10, wherein:
    the blue-excited yellow phosphor is different than the violet-excited yellow phosphor; and the blue-excited red phosphor is different than the violet-excited red phosphor.

12. The lamp of claim 1, further comprising:
a polycarbonate cover that is fixed to the support structure and through which the combined white light exits the lamp.

13. The lamp of claim 1, wherein the one or more blue-pumped SSLEs and the one or more violet-pumped SSLEs comprise multiple blue-pumped SSLEs that are alternating interspersed between multiple violet-pumped SSLEs.

14. The lamp of claim 13, wherein the number of blue-pumped SSLEs is in the range 90%-110% of the number of violet-pumped SSLEs.

15. The lamp of claim 13, wherein the number of blue-pumped SSLEs equals the number of violet-pumped SSLEs.

16. The lamp of claim 13, wherein the blue-pumped SSLEs and the violet-pumped SSLEs are arranged in multiple rows, each row comprising blue-pumped SSLEs of the row alternating interspersed between violet-pumped SSLEs of the row.

17. The lamp of claim 16, wherein the blue-pumped SSLEs and the violet-pumped SSLEs are arranged also in multiple columns that are perpendicular to the rows, each column comprising blue-pumped SSLEs of the column alternating interspersed between violet-pumped SSLEs of the column.

18. A lamp comprising:
blue-pumped solid state light emitters (SSLEs), each having
a blue excitation source configured to output blue light, and
one or more blue-pumped phosphors for converting a portion of the blue light to non-blue visible light, for the blue-pumped SSLEs to output blue-pumped white light;
violet-pumped SSLEs, each having
a violet excitation source configured to output violet light, and
one or more violet-pumped phosphors for converting a portion of the violet light to non-violet visible light, for the violet-pumped SSLEs to output violet-pumped white light; and
a support structure configured to fixedly support the blue-pumped SSLEs and the violet-pumped SSLEs in an orientation such that the blue-pumped white light and the violet-pumped white light will propagate in a common direction and intermix with each other through beam-spreading to yield a combined white light;
wherein the blue-pumped SSLEs and the violet-pumped SSLEs are arranged in a circular series in which the blue-pumped SSLEs are alternating interspersed between the violet-pumped SSLEs along a circular path.

19. The lamp of claim 18, wherein the lamp has no SSLEs located within the circular path.

20. A lamp comprising:
blue-pumped solid state light emitters (SSLEs), each having
a blue excitation source configured to output blue light, and
one or more blue-pumped phosphors for converting a portion of the blue light to non-blue visible light, for the blue-pumped SSLEs to output blue-pumped white light;
violet-pumped SSLEs, each having
a violet excitation source configured to output violet light, and
one or more violet-pumped phosphors for converting a portion of the violet light to non-violet visible light, for the violet-pumped SSLEs to output violet-pumped white light; and
a support structure configured to fixedly support the blue-pumped SSLEs and the violet-pumped SSLEs in an orientation such that the blue-pumped white light and the violet-pumped white light will propagate in a common direction and intermix with each other through beam-spreading to yield a combined white light, wherein:
the blue-pumped SSLEs and the violet-pumped SSLEs are arranged in rows,
each row comprises blue-pumped SSLEs of the row alternating interspersed between violet-pumped SSLEs of the row, and
the rows are staggered in that each SSLE in at least some of the rows is aligned between two SSLEs in the row above and between two LEDs in the row below.

* * * * *